United States Statutory Invention Registration [19]

[11] Reg. Number: H44

Moran [45] Published: Apr. 1, 1986

[54] ELECTRONIC PHASE SHIFTER HAVING A CONSTANT MAGNITUDE OUTPUT

[75] Inventor: Robert D. Moran, Dahlgren, Va.

[73] Assignee: The United States of America as represented by the Secretary of the Navy, Washington, D.C.

[21] Appl. No.: 493,482

[22] Filed: May 11, 1983

[51] Int. Cl.[4] ..... H03K 5/00; H03K 3/42

[52] U.S. Cl. ..... 307/262; 307/311; 307/511; 328/155

[58] Field of Search ..... 307/262, 511, 510, 311; 328/155, 140, 135

[56] References Cited

U.S. PATENT DOCUMENTS

| | | | |
|---|---|---|---|
| 3,446,996 | 5/1969 | Toffler | 30 7/520 |
| 3,614,475 | 10/1971 | Deboe | 307/262 |
| 3,852,624 | 12/1974 | Marik et al. | 307/295 |
| 3,995,235 | 11/1976 | Kaplan | 332/17 |
| 4,087,737 | 5/1978 | DeGennaro | 323/108 |
| 4,138,635 | 2/1979 | Quinn | 323/21 |
| 4,228,368 | 10/1980 | Orban | 307/262 |
| 4,309,649 | 1/1982 | Naito | 323/212 |

OTHER PUBLICATIONS

"Characteristics and Operation of MOS Field Effect Devices", by Paul Richman, 1967, McGraw Hill, pp. 116–119.

"IC Schematic Source Master", Kendall Webster Series, John Wiley & Sons, 1978, p. 226.

*Primary Examiner*—S. C. Buczinski

*Assistant Examiner*—Linda J. Wallace

*Attorney, Agent, or Firm*—Robert F. Beers; Kenneth E. Walden; Frederick A. Wein

[57] ABSTRACT

An electronic phase shifter for shifting the phase of a sine wave at an input terminal, as measured at an output terminal, without affecting the magnitude thereof and having the ability to operate over a wide range of input voltages is disclosed. The electronic phase shifter comprises, inter alia, an operational amplifier and a unique variable output resistance device. A control signal, in the form of a current, for controlling the phase shift of the sine wave is applied to the input of the variable output resistance device. Buffering of the electronic phase shifter from preceding stages is controlled by matched resistors operatively connected between its output and input terminals and the inverting input terminal of the operational amplifier. The operating frequency range of the electronic phase shifter, and, accordingly, the phase shift range, is controlled by a capacitor connected from its input terminal to the non-inverting input terminal of the operational amplifier.

3 Claims, 3 Drawing Figures

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

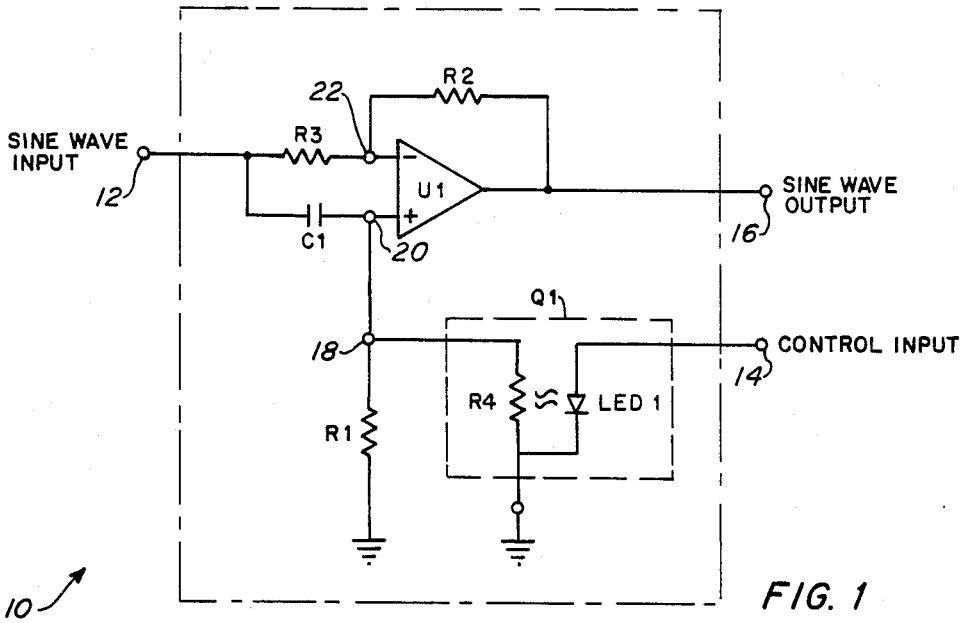
FIG. 1
FIG. 2
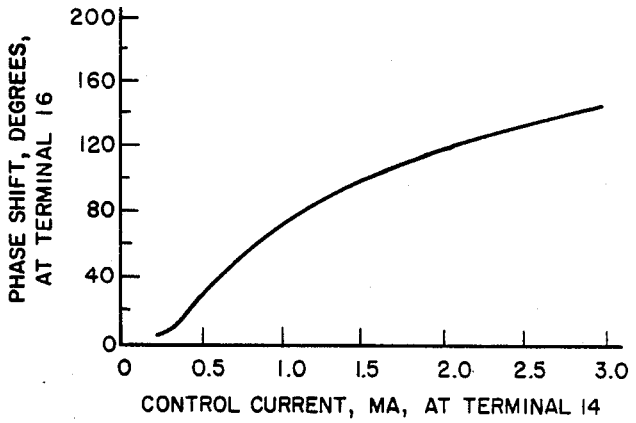
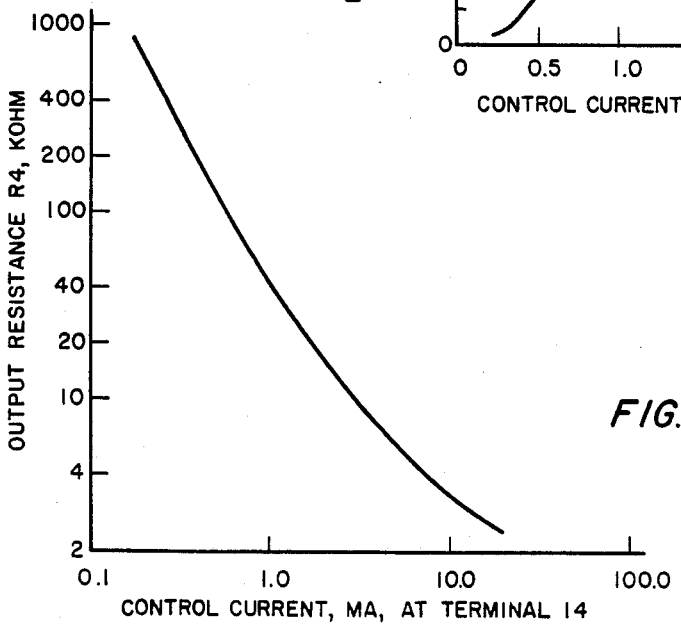
FIG. 3

ELECTRONIC PHASE SHIFTER HAVING A CONSTANT MAGNITUDE OUTPUT

BACKGROUND OF THE INVENTION

1. Field of the Invention

The present invention relates to electronic phase shifters, but more specifically it relates to an electronic phase shifter wherein a sine wave can be phase shifted without affecting the magnitude thereof over a wide input magnitude range as measured at the output of the electronic phase shifter.

2. Description of the Prior Art

The phase shifting of sine wave type signals is accomplished in many different ways depending on system requirements. For example, there are networks having mechanical adjusters which shift the phase of one voltage with respect to another voltage of the same frequency; there are devices which produce, from a single input waveform, two or more output waveforms that differ in phase from one another; and, there are devices in which the output voltage (or current) may be adjusted to have some desired phase relationship with the input voltage (or current). Respectively, each of the foregoing has had operational deficiencies such as use limited to low frequency applications because of the inability of the arrangement to respond to the more rapid phase shifting rates required with the higher frequencies; the phase difference between the two or more output waveforms varying substantially with frequency so that practical use with a reasonable frequency range is limited; and, the amplitude of phase shifted output voltage (or current) varying substantially with frequency, and/or the phase shift is fixed at, say, −90°.

The foregoing operational deficiencies have to a large degree been eliminated, but usually with the added disadvantages of increased costs, limited signal voltage range, increased circuit complexity, unpredictability of unit-to-unit performance and decreased reliability. Consequently, there is a need in the prior art to configure an electronic phase shifter capable of substantially 180° phase shift over a wide frequency range but yet having an output magnitude unaffected by the phase shifting operation while eliminating the foregoing disadvantages.

The prior art, as indicated hereinabove, include advances in phase shifters, including eliminating changes in the amplitude of the output waveform with changes in phase shifting. However, insofar as can be determined, no prior art phase shifter incorporates all of the features and advantages of the present invention.

OBJECTS OF THE INVENTION

Accordingly, a principal object of the present invention is to configure a phase shifter to phase shift a sine wave electronically without substantially affecting the magnitude thereof, while maintaining its ability to operate over a wide range of input voltage levels in an improved manner.

Another object of the present invention is to accomplish the foregoing object while decreasing costs, decreasing circuit complexity, increasing predictability of unit-to-unit performance and increasing reliability.

SUMMARY OF THE INVENTION

In accordance with the above stated objects, other objects, features and advantages, the present invention has as a primary purpose the phase shifting of sine waves having a wide range of amplitudes without substantially affecting their amplitudes or magnitudes .

The essence of the present invention is in the use of a control current as a phase control signal to drive a variable output resistance device which comprises a light-emitting diode-photoconductor pair. The combination of the light-emitting diode-photoconductor pair has an output resistance that varies as a function of the current to its input. The use of the light-emitting diode-photoconductor pair allows the electronic phase shifter to operate over an input voltage range up to the saturation voltage of an operational amplifier portion thereof. This operating voltage range cannot easily be achieved with other variable resistance devices such as field effect transistors.

The purpose of the present invention is carried out by connecting the variable output resistance device to the non-inverting input of the operational amplifier across a resistor to ground. Another resistor is connected from the output of the operational amplifier, which is also the output of the electronic phase shifter, to the inverting input thereof providing negative feedback thereto. Yet another resistor is connected in series with the inverting input of the operational amplifier and a capacitor is connected in series to the non-inverting input thereof. The other ends of the latter resistor and the capacitor are connected together to form the sine wave input terminal of the electronic phase shifter.

BRIEF DESCRIPTION OF THE DRAWINGS

The previously stated objects, other objects, features and advantages of the present invention will be apparent from the following more particular description of a preferred embodiment as illustrated in the accompanying drawings, in which:

FIG. 1 is an electronic phase shifter configured according to the present invention;

FIG. 2 is a graph showing the phase shift as measured at the output terminal verses the control current as measured at the control input terminal of the electronic phase shifter of FIG. 1; and FIG. 3 is a graph showing the transfer function, i.e., output resistance versus input control current, of a variable output resistance device suitable for use with the electronic phase shifter of FIG. 1.

DESCRIPTION OF THE PREFERRED EMBODIMENT

FIG. 1 shows an embodiment of an electronic phase shifter 10 in which the present invention is employed to phase shift sine waves having a wide range of amplitudes without substantially affecting their amplitudes or magnitudes. The electronic phase shifter 10 includes a sine wave input terminal 12, a control input terminal 14 and a phase shifted sine wave output terminal 16. Internally, the electronic phase shifter 10 comprises an operational amplifier U1, a variable output resistance device Q1, resistors R1, R2 and R3 and a capacitor C1. The variable output resistance device Q1, represented by the equivalent circuit shown, includes a light-emitting diode LED1 and a light sensitive resistor R4 which are electrically isolated from each other. Light sensitive resistor R4 can comprise a material like cadmium selenide or cadminum sulphide.

Briefly, the variable output resistance device Q1 is connected via its output terminal 18 to the non-inverting input terminal 20 of the operational amplifier U1 across the resistor R1 to ground. The second resistor R2 is connected from the output of the operational amplifier U1, which is also connected to the sine wave output terminal 16, to the inverting input terminal 22 thereof. The resistor R3 is connected in series to the inverting input terminal 22 of the operational amplifier U1, and the capacitor C1 is connected in series to the non-inverting input terminal 20 of the operational amplifier U1. The other ends of the resistor R3 and the capacitor C1 are connected together at the sine wave input terminal 12 of the electronic phase shifter 10.

STATEMENT OF THE OPERATION

Details of the operation, according to the present invention, are explained in conjunction with FIGS. 1, 2 and 3 viewed concurrently .

As previously stated, the electronic phase shifter 10 of FIG. 1 is capable of nearly 180° phase shift. The phase shift $\theta$ is defined by: $\theta=2\tan^{-1}(1/\omega CR)$, where $\omega$ is the radian frequency and is equal to $2\pi f$, where f is the electrical frequency, C is the value of the capacitor C1 and R is the value of the resistor R4 connected in parallel with the resistor R1. The phase shift is not affected by the value of the resistors R2 and R3 as the above equation indicates; however, they must be matched and large enough to provide proper buffering of the preceding stages (not shown).

The value of C for capacitor C1 is chosen so as to obtain the desired phase shift range at the frequency of interest considering the characteristics of variable output resistance device Q1. Since unlike a variable resistance device such as a field effect transistor, the change in the resistor R4 of variable resistance device Q1 is completely independent of the amplitude of the signal at sine wave input terminal 12. Also, as shown, the resistor R4 is electrically isolated from the control current at the control input terminal 14. This configuration will operate with input signal voltages up to the saturation voltage of the operational amplifier U1. In addition, the capacitor C1, and the resistor R4 of the variable resistance device Q1 may be interchanged, so that the resistor R4 is connected from the sine wave signal input terminal 12 of the electronic phase shifter 10 to the non-inverting input terminal 20 of the operational amplifier U1 and the capacitor C1 is connected from the non-inverting input terminal 20 of the operational amplifier U1 to ground. This congifuration, which cannot be easily achieved with a variable resistance device such as a field effect transistor, reverses the sense of the phase shift, such that the phase shift $\theta$ is now defined by: $\theta=-2\tan^{-1}(\omega CR)$. The purpose of the resistor R1 in both configurations is to provide a bias current path for the operational amplifier U1 when the value of the resistor R4 becomes extremely large. The value of the resistor R1 is chosen large so that the phase shift range of the electronic phase shifter 10 is not significantly affected thereby.

As shown, FIG. 2 is a plot of phase shift as measured at the sine wave output terminal 16 versus control current at the control input terminal 14. This control current feeds the variable resistance device Q1 whose input/output characteristics are shown in FIG. 3. For purposes of the present invention, a Vactrol, which is a light-emitting diode-photoconductor pair manufactured by Vactec, Inc., and, which can be represented by the equivalent circuit of the variable output resistance device Q1 of FIG. 1, is preferred due to its simplicity, reliability, and long operating life. However, any circuit or device with a similar transfer characteristic and electrical isolation between its input and output can be used.

To those skilled in the art, many modifications and variations of the present invention are possible in light of the above teachings. It is therefore to be understood that the present invention can be practiced otherwise than as specifically described herein and still be within the spirit and scope of the appended claims.

What is claimed is:

1. An improved electronic phase shifter of the type having an input terminal and an output terminal, first and second resistors of equal value connected in series between the input and output terminals, and an operational amplifier having a predetermined saturation voltage and having its output connected to the output terminal and its inverting input terminal connected to the junction of said first and second resistors of equal value, wherein the improvement comprises:

a capacitor having a predetermined value connected between the input terminal and the non-inverting input terminal of said operational amplifier; and a LED-photoresistor device for developing a variable generally linear output resistance over a predetermined range at its output terminal in response to a control current from a variable controlled current source over a corresponding predetermined current range at its input terminals, the input and output terminals of said LED-photoresistor device being electrically isolated from each other, said LED-photoresistor device having its output terminal connected between the junction of said capacitor and the non-inverting input terminal of said operational amplifier and to ground, a sine wave having a predetermined magnitude at the input terminal of said electronic phase shifter being phase shifted an amount $\theta$, as measured at the output terminal thereof, over a wide amplitude range of input voltages up to the saturation voltage of the operational amplifier without substantially affecting the predetermined magnitude of the sine wave after phase shifting, $\theta$ being defined as $\theta=2\tan^{-1}(1/\omega CR)$, where $\omega$ is the radian frequency of the sine wave and is equal to $2\pi f$, where f is the electrical frequency of the sine wave, C is the predetermined value of said capacitor and R is a value of resistance equal to the variable output resistance of said LED-photoresistor device.

2. The improved electronic phase shifter of claim 1 wherein said variable output resistance device comprises:

a light-emitting diode having its anode connected to the control current input terminal of said electronic phase shifter and its cathode to ground; and a light sensitive resistor having one end thereof connected to the junction of said capacitor and the non-inverting input terminal of said operational amplifier and the other end thereof connected to ground so as to be electrically isolated from said light-emitting diode, and so as to be connected in parallel with said third resistor.

3. The improved electronic phase shifter of claim 2 wherein said light sensitive resistor comprises a material selected from a group consisting of cadmium selenide and cadminum sulphide.

* * * * *